United States Patent
Mocuta et al.

(10) Patent No.: US 7,560,326 B2
(45) Date of Patent: Jul. 14, 2009

(54) SILICON/SILCION GERMANINUM/SILICON BODY DEVICE WITH EMBEDDED CARBON DOPANT

(75) Inventors: Anda C. Mocuta, LaGrangeville, NY (US); Dureseti Chidambarrao, Weston, CT (US); Ricardo A. Donaton, Cortlandt Manor, NY (US); David M. Onsongo, Newburgh, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 11/381,810

(22) Filed: May 5, 2006

(65) Prior Publication Data

US 2007/0257249 A1    Nov. 8, 2007

(51) Int. Cl.
*H01L 21/8234*   (2006.01)
*H01L 31/0392*   (2006.01)

(52) U.S. Cl. .................. 438/197; 438/285; 438/299; 438/301; 438/303; 257/19; 257/192; 257/347; 257/E21.207; 257/E21.411

(58) Field of Classification Search ............... 438/197, 438/285, 301; 257/19, 192, 347, 349
See application file for complete search history.

(56) References Cited

U.S. PATENT DOCUMENTS

| | | | |
|---|---|---|---|
| 6,512,252 B1 * | 1/2003 | Takagi et al. ............... | 257/192 |
| 2005/0064686 A1 | 3/2005 | Chidambarrao et al. | |
| 2005/0082616 A1 | 4/2005 | Chen et al. | |
| 2005/0085022 A1 | 4/2005 | Chidambarrao et al. | |
| 2005/0260807 A1 * | 11/2005 | Orlowski et al. ............ | 438/197 |

FOREIGN PATENT DOCUMENTS

| | | |
|---|---|---|
| CN | 1218994 | 6/1999 |
| CN | 1364309 | 8/2002 |
| CN | 1437769 | 8/2003 |

* cited by examiner

*Primary Examiner*—Dao H Nguyen
(74) *Attorney, Agent, or Firm*—Daniel Schnumann; Greenblum & Bernstein P.L.C.

(57) ABSTRACT

A semiconductor structure and method of manufacturing a semiconductor device, and more particularly, an NFET device. The devices includes a stress receiving layer provided over a stress inducing layer with a material at an interface there between which reduces the occurrence and propagation of misfit dislocations in the structure. The stress receiving layer is silicon (Si), the stress inducing layer is silicon-germanium (SiGe) and the material is carbon which is provided by doping the layers during formation of the device. The carbon can be doped throughout the whole of the SiGe layer also.

2 Claims, 7 Drawing Sheets

SILICON/SILCION GERMANINUM/SILICON BODY DEVICE WITH EMBEDDED CARBON DOPANT

FIELD OF THE INVENTION

The invention relates generally to a semiconductor device and method of manufacturing, and more particularly to a semiconductor device and method of manufacturing an NFET and PFET device with stress components.

BACKGROUND DESCRIPTION

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the NFETs and/or PFETs. But, it is well known that stress components affect the behaviors of NFET and PFET devices differently.

In order to maximize the performance of both NFETs and PFETs within integrated circuit (IC) chips, the stress components should be engineered and applied differently for NFETs and PFETs. The stress components should be engineered and applied differently because the type of stress which is beneficial for the performance of an NFET is generally disadvantageous for the performance of the PFET. More particularly, when a device is in tension, the performance characteristics of the NFET is enhanced while the performance characteristics of the PFET is diminished.

To accommodate the different stress requirements, it is known to use different material combinations to apply tensile stress to NFETs and compressive stress to PFETs. In known processes for implementing stresses in FETs, distinct processes and/or materials are used to create the tensile or compressive stresses in the NFETs and PFETs, respectively. It is known, for example, to use a trench isolation structure for the NFET and PFET devices. According to this method, the isolation region for the NFET device contains a first isolation material which applies a first type of mechanical stress on the NFET device in a longitudinal direction and in a transverse direction. Further, a first isolation region and a second isolation region are provided for the PFET and each of the isolation regions of the PFET device applies a unique mechanical stress on the PFET device in the transverse direction.

Additional methods to provide strain for both NFET and PFET include the use of patterned, tensile or compressively strained silicon nitride layers for spacers or gate sidewalls, or for contact studs etch stop liners.

While these methods do provide structures that have tensile stresses being applied to the NFET device and compressive stresses being applied along the longitudinal direction of the PFET device, they require additional materials and/or more complex processing, and thus, result in higher cost. Also, the levels of induced stress with these methods tend to saturate and also become lower with technology scaling. Further, in current fabrication devices, a method and device including both NFET and PFET devices on the same substrate including an embedded SiGe layer in the gate region of the NFET, and an embedded SiGe layer in the PFET source/drain region are provided during separate processes. These more recent methods provide strained channel NFET and PFET devices where the stresses increase with further gate length scaling and are minimally impacted by overall design ground rules scaling.

A drawback in the area of strain for these channels is the formation of misfit dislocations that result in a decrease of charge mobility and thus device performance. Such undesired dislocation misfits form as the device is built and treated at elevated temperature.

The issue of strain relaxation in the silicon film becomes even more critical for thermally mixed silicon germanium on insulator devices (SGOI), where the total film thickness has to be maintained very thin (less than 500 Å). In thermally mixed SGOI a defect-free, relaxed SiGe layer is formed on insulator followed by epitaxial growth of a buffer SiGe layer and then the Si layer. If the final film thickness has to be less than 500 Å, a buffer SiGe layer cannot be grown due to thickness limitations and the strained Si layer has to be grown directly on the thermally mixed SGOI film. In this case the epi growth interface is at the SiGe/Si interface. This interface usually has defects and misfits dislocation generation which result in a strain relaxation during device processing.

SUMMARY OF THE INVENTION

In a first aspect of the invention, a method of fabricating a semiconductor structure includes forming a stress receiving layer over a stress inducing layer with an interface therebetween. The method further includes providing a carbon doping between the stress receiving layer and the stress inducing layer which reduces misfit dislocations in the structure.

In a second aspect of the invention, a semiconductor structure includes at least one gate stack disposed on a stress containing structure having a first material, a second material and a carbon doped material. The carbon doped material is configured to reduce misfit dislocations in the structure. The carbon doped material can be at an interface of the first material and the second material. The first material or a part thereof can be carbon doped or the second material or a part thereof can be carbon doped. The first material is a stress inducing material and the second material is a stress receiving layer.

In a third aspect of the invention, a semiconductor device includes an NFET device disposed on a layered structure comprising a SiGe stress inducing layer, a Si stress receiving layer and a carbon doped material which reduces misfit dislocations at an interface between the SiGe stress inducing layer and the Si stress receiving layer.

DETAILED DESCRIPTION OF EMBODIMENTS OF THE INVENTION

The invention relates to a semiconductor structure and method of manufacturing and more particularly to an NFET device with at least one SiGe layer and at least one silicon layer with adjacent source/drain regions. In embodiments of the invention, the interface region of the two layers contains carbon to some extent. In further embodiments, the SiGe layer can be initially unrelaxed without any relaxation mechanisms or relaxed with plastic flow. The SiGe layer may be doped with carbon forming a carbon doped SiGe layer. In still further embodiments, a combination of carbon at the interface, in addition to the relaxed or unrelaxed SiGe layer being doped with the carbon is contemplated. In embodiments, the structure of the invention enhances the electron mobility in the NFET device through stress transfer and regulates the number or formation of misfit dislocations and threading dislocations that usually arise in the manufacturing process of the device, especially the annealing step.

In embodiments, the presence of carbon in a percentage ranging between 0.01% and 1% (atomic percent) in the region between the relaxed or unrelaxed SiGe and silicon interface prevents the formation and also propagation of such misfit dislocations. Likewise, in embodiments, the presence of relaxed or unrelaxed carbon doped SiGe, or the combination of relaxed or unrelaxed carbon doped SiGe and carbon doped silicon at the interface of the SiGe layer and the silicon prevents the formation and also propagation of such misfit dislocations.

The amount of carbon can be tailored for a particular thermal cycle needed for dopant activation and for a particular strain and thickness of the strained silicon film. Furthermore, the carbon concentration needed to prevent strain relaxation due to the presence of misfit dislocations is small and does not affect the lattice constant of the stress inducing SiGe layer. In one embodiment, it is beneficial to incorporate carbon in the first few monolayers of growth of the strained Si layer.

In another embodiment, the carbon doping can be initiated near the end of the growth of the SiGe layer and can be continued as the Si layer is grown, thus the carbon doped zone ranges from the SiGe layer into the Si layer. In embodiments, the incorporation of carbon at the interface region of a SiGe/Si stack or solely in the SiGe layer or solely in the silicon layer, amongst other potential benefits, allows (i) for strain stability in the Si film and entire structure, due to the lack or lesser presence of misfit dislocations, thus resulting in improved device performance; (ii) for an increase of strained Si film thickness while maintaining a higher strain than films lacking the carbon content in the case of the initially relaxed SiGe structures; and (iii) for a higher strain for a given Si film thickness, resulting in enhanced NFET mobility and device performance for either the initially unrelaxed or initially relaxed SiGe cases.

Figure 1A:
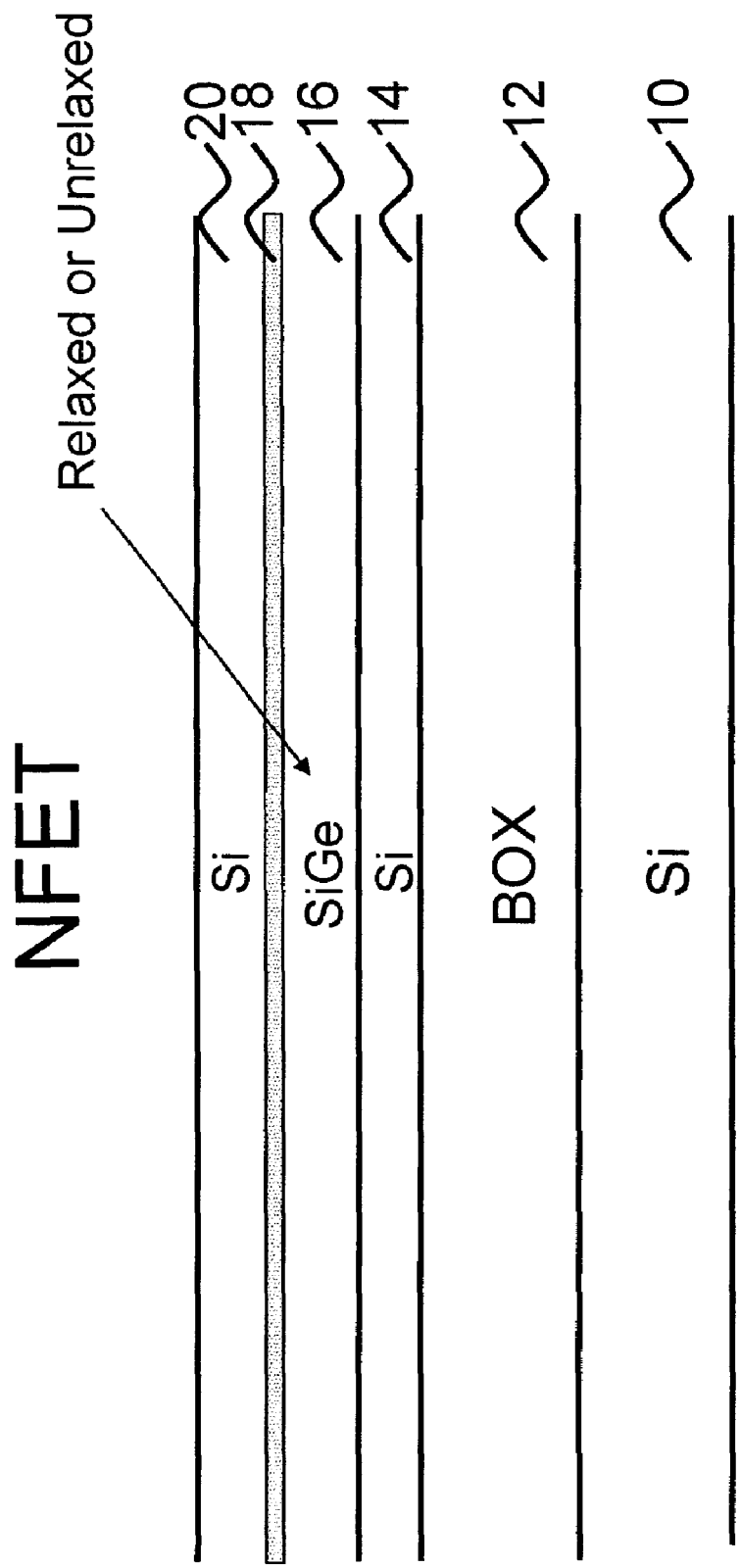
FIGS. 1a-1d are representative of sectional schematic views of processing steps and structures in accordance with the invention and their physical properties.

FIGS. 1a through 1d depict a fabrication process to form the NFET device in accordance with the invention. In FIG. 1a, a substrate 10 such as, for example, silicon-on-insulator (SOI) or the like is provided. An optional buried oxide layer (BOX) may be formed on the substrate 10 using typical SIMOX or bonding processes well known in the art. A silicon layer 14 is on top of the BOX 12 in either SIMOX or Bonded substrates. A relaxed or unrelaxed SiGe layer 16 is selectively grown on the silicon layer 14, followed by another silicon layer 20. The relaxation process, for the initially relaxed film, are by standard thermally mixed SGOI processes known in the art. Region 18 depicts a carbon containing zone at the interface of layers 16 and 20, whereby the content of carbon can reach into the SiGe layer 16 and or into the Si layer 20. It should be understood, though, that the relaxed or unrelaxed SiGe layer 16 can be doped with carbon, thus forming a carbon doped SiGe layer, while maintaining its relaxed or unrelaxed state. In this implementation, the carbon region 18 may be eliminated, although in further embodiments, a combination of the carbon doped relaxed or unrelaxed SiGe layer 16 and a carbon doped layer 20 is contemplated by the invention.

In embodiments, the thicknesses of the layers are in various ranges including, for example, the substrate layer 10 is typically 0.7 mm. The BOX may be between 0 Å and 1200 Å, and the silicon layers 14 and 20 may range between 90 and 350 Å, preferably 100 to 200 Å in thickness. Additionally, the SiGe layer 16 may range between 100 to 600 Å, preferably 200 to 400 Å range. It should be understood that the thickness of layers 16 through 20 can vary and reach a combined thickness between 300 and 1000 Å, depending on the various design parameters of the device.

Region 18 does not necessarily constitute an isolated material part of the invention and, in embodiments, may not contribute to the overall thickness of the gate stack. For example, the SiGe layer 16 may be a carbon doped layer, thus eliminating the need for labeling a zone 18 in FIGS. 1a-1d. Thus, while FIGS. 1a-1d show layer 18, it should be understood that other embodiments are also contemplated by the invention as discussed above (e.g., the layer 18 may be eliminated from the structure completely or combined with the carbon doped SiGe layer and/or combined with the carbon dope silicon layer). In embodiments, the layer 18 can be regarded as a region governing the interface of layers 16 and 20, which additionally contains carbon dopants, with a region thickness of 50 to 500 Å, thereby ranging between 0 Å to 500 Å into SiGe layer 16 and 0 Å to 200 Å into Si layer 20.

In implementation, the relaxed or unrelaxed SiGe layer 16 is selectively grown in a conventional manner. The germanium content may be greater than 0% in ratio to the Si content, with a range of 15% to 35% being contemplated by the invention. The carbon doping resulting in zone 18 can be initiated at any point during the growth of layer 16 by adding the carbon containing precursor to the chemical vapor during the deposition process at desired atomic percentages. Carbon doping is continued after completion of the growth of layer 16 and during the growth of layer 20 to any desired extent. Carbon doping is terminated by halting the carbon precursor stream in the chemical vapor deposition process while growth of silicon layer 20 is continued. The atomic percentage of carbon in zone 18 ranges from 0.01% to 1.0%, preferably 0.2% and preferably above a concentration of $10^{20}$ carbon atoms/cm$^3$ to efficiently reduce the misfit dislocations.

Because Si has a smaller lattice constant (i.e., atom spacing) than relaxed SiGe, the top growing Si layer 20 is subject to a tensile strain, i.e. silicon atoms are spaced farther apart than in their inherent state. This strain-induced spacing is regularly accompanied by formation of misfit dislocations, i.e., deformation of the initially strained silicon layer during the heating process, where isolated silicon atoms abandon their position in the lattice for an energetically more favorable position resembling its elemental lattice constant. This formation of misfit dislocations depends on the process after strain-induction, e.g. heating of the wafer and the like, and also of the content of germanium in the underlying layer 18.

Interestingly, it has been found that addition of small amounts of carbon to the interface and, in embodiments, into the relaxed or unrelaxed SiGe layer reduces the formation and propagation of misfit dislocations in silicon layer 20. Therefore, the concentration of carbon is in correlation with the content of germanium in layer 18. The amount of carbon in the silicon layer appears to have no adverse effect on the electron mobility in the channel.

Figure 1B:
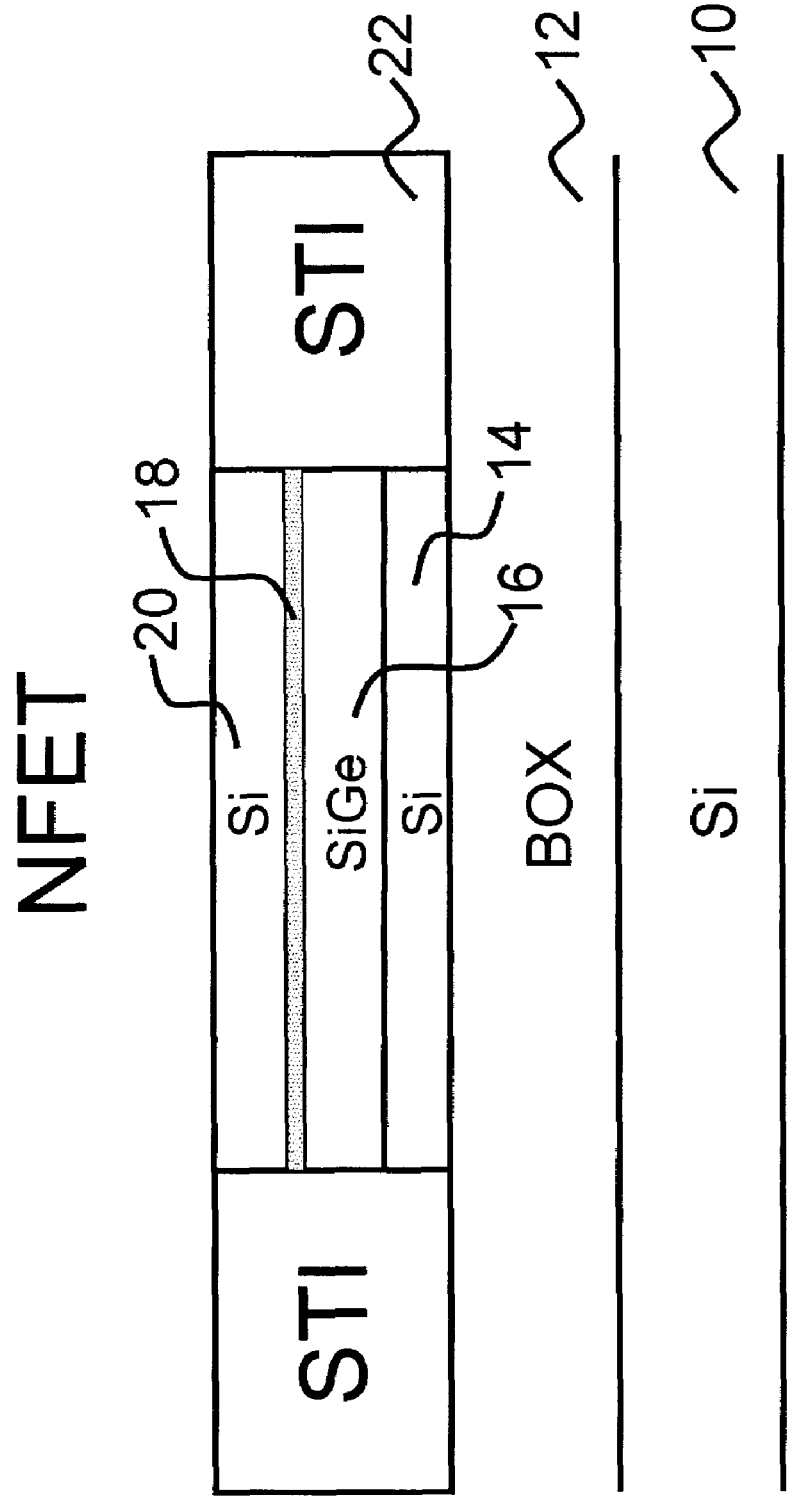

FIG. 1b shows the separated channel formed by shallow trench isolation (STI) 22. The insulating trenches 22 are formed by conventional patterning processes including lithography and etching steps. For example, a patterning process is used to form STI 22 using standard techniques of pad oxidation, pad nitride deposition, lithography based patterning, reactive ion etching (RIE). A liner deposition, fill deposition, and chemical mechanical polish, for example, can then be used to form STI 22. The STI formation process is well known in the art.

Figure 1C:
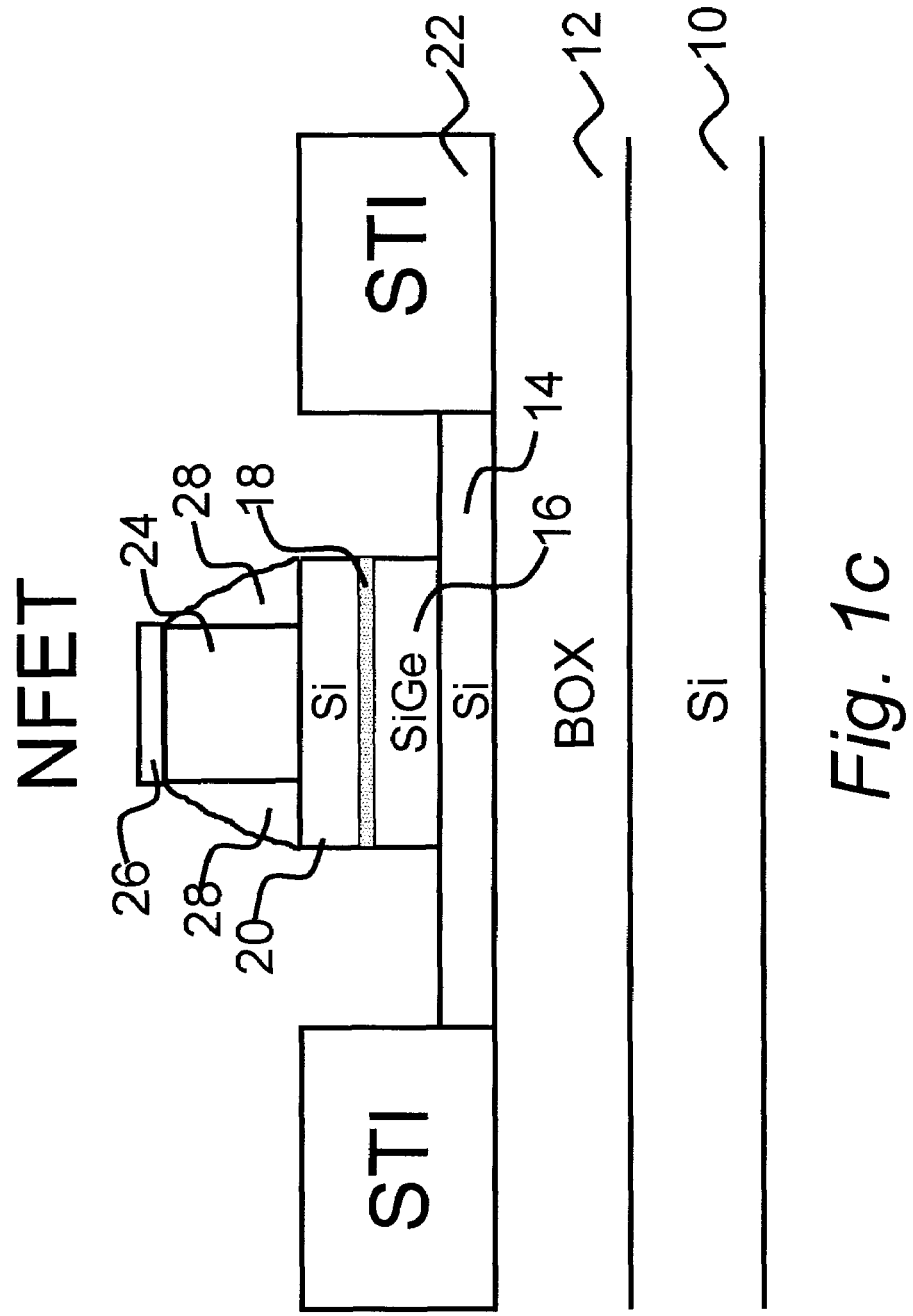

FIG. 1c depicts the NFET device prior to the placement of the source and drain (S/D) material. Although, the process is shown for the NFET device, the formation of the gate is not necessarily separated from the formation of the PFET device, but can be performed simultaneously. A polysilicon gate 24 is grown in the center of the stack by means of conventional patterning processes, which include lithography and etching steps. By way of example a polysilicon block is formed on the structure. A lithography process is applied which entails applying a photoresist on the structure, exposing the photoresist to a pattern of radiation, and developing the pattern utilizing a conventional resist developer. Following the lithography step, a conventional etching process is applied such as RIE, plasma etching, ion beam etching, or laser ablation may be employed in transferring the pattern to active areas of the NFET region (and also the PFET region) to form polysilicon gate 24. A SiN cap 26 is placed and sidewall spacers 28 are formed, which will act as an etching stop cap, in embodiments.

The cap 26 and sidewall spacers 28 are also formed in a conventional manner. In this processing, a sacrificial block material is deposited on the structure. In one embodiment, the sacrificial material is a nitride compound (e.g., $Si_3N_4$), which forms the SiN elements 26 and 28. The elements 26, 28 can be formed in a conventional manner, such as by chemical vapor deposition (CVD) using a silane source. Other techniques which may be suitable for forming a nitride layer include LPCVD and atmospheric pressure CVD (APCVD). The size of the polysilicon gate 24 and its two sidewalls 28, which cover the underlying layers 16 through 20 in the NFET region, ranges from 500 to 1000 Å, whereby the spacers have a preferred width of 100 Å, leaving the size of the gate 24 in a range of 300 to 800 Å, preferably 400 Å for the NFET device.

Still referring to FIG. 1c, the well regions in the NFET adjacent to the stack formed by layers 16 to 20 and elements 24 to 28 are etched down ideally to silicon layer 14. This etching will induce tensile strain on the upper Si layer, by an elastic stress transfer mechanism from the initially unrelaxed SiGe layer. Alternatively, this etching will increase the tensile strain placed substantially on the entire upper Si layer when using the relaxed SiGe layer since an elastic component is added.

Figure 1D:
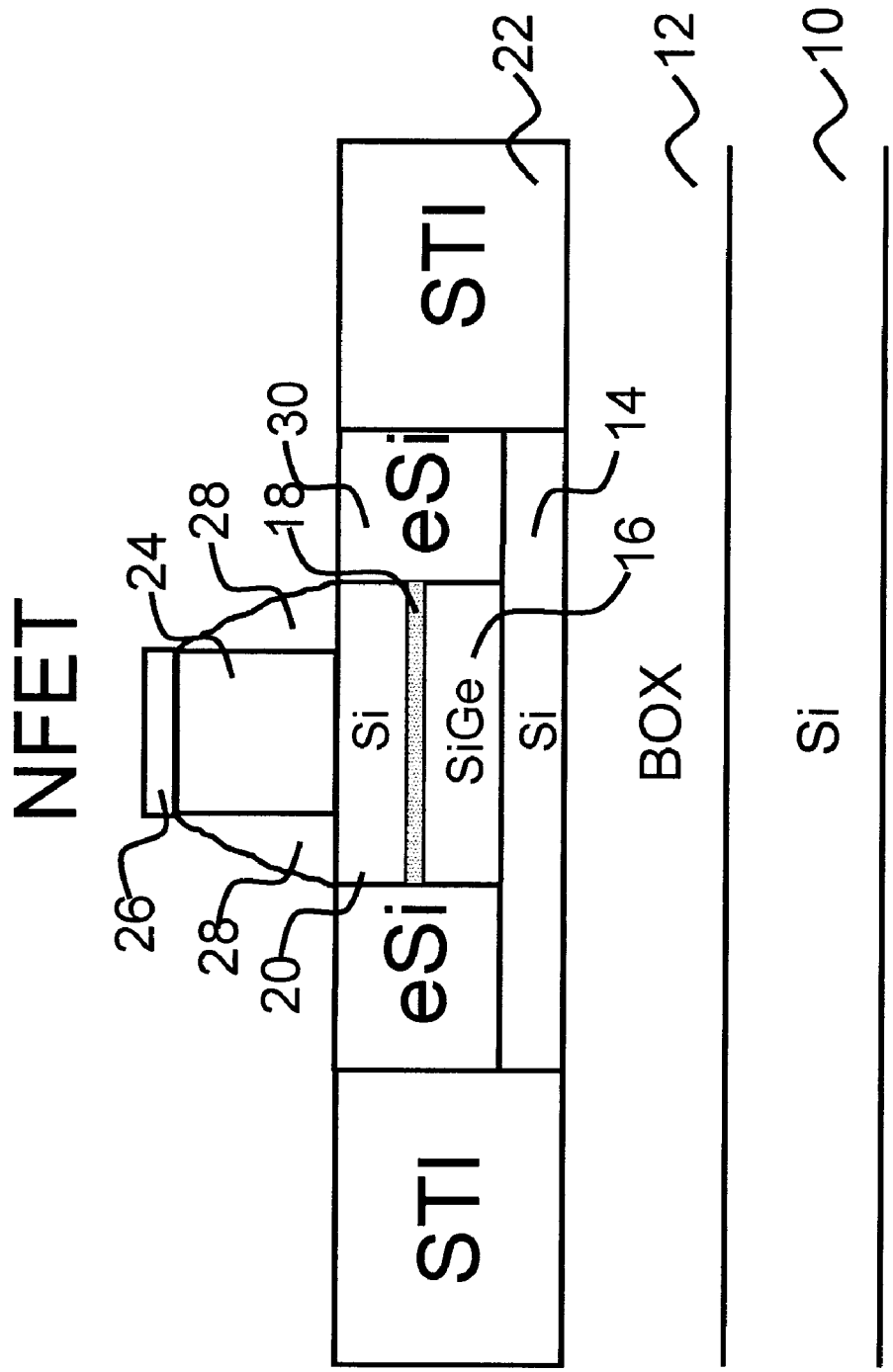

FIG. 1d depicts the device after epitaxially grown silicon (eSi) 30 is filled in the S/D wells adjacent to the gate island formed by the SiGe and Si layers (carbon doped). In view of the above described dimensions, the remaining gate island results in a longitudinal size placed in a tensile stress, as should be understood by those of skill in the art.

Figure 2A:
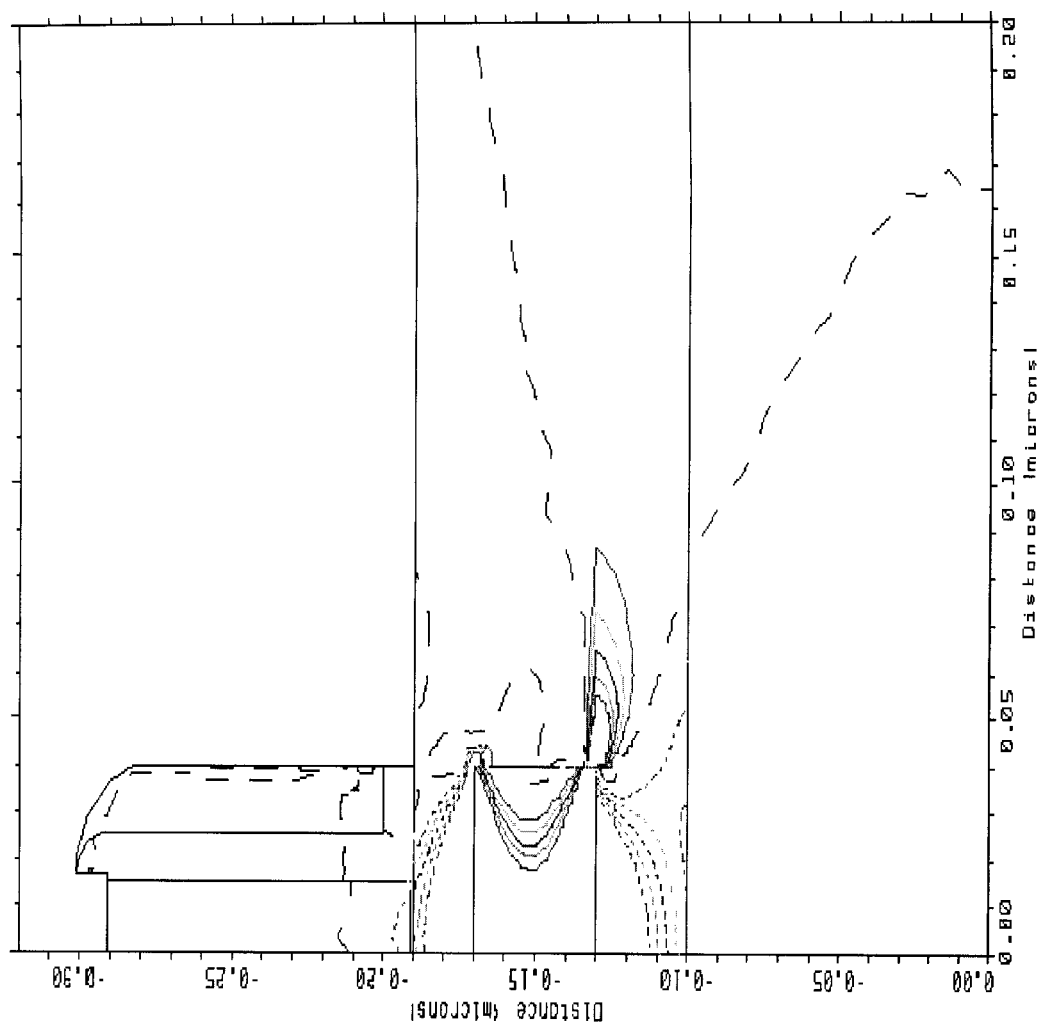
FIGS. 2a and 2b are representative cross-sectional views showing the calculated tensile stress state in the channel in accordance with an implementation of the invention where the stress inducing SiGe transfers the tensile stress into the stress receiving Si.
Figure 2B:
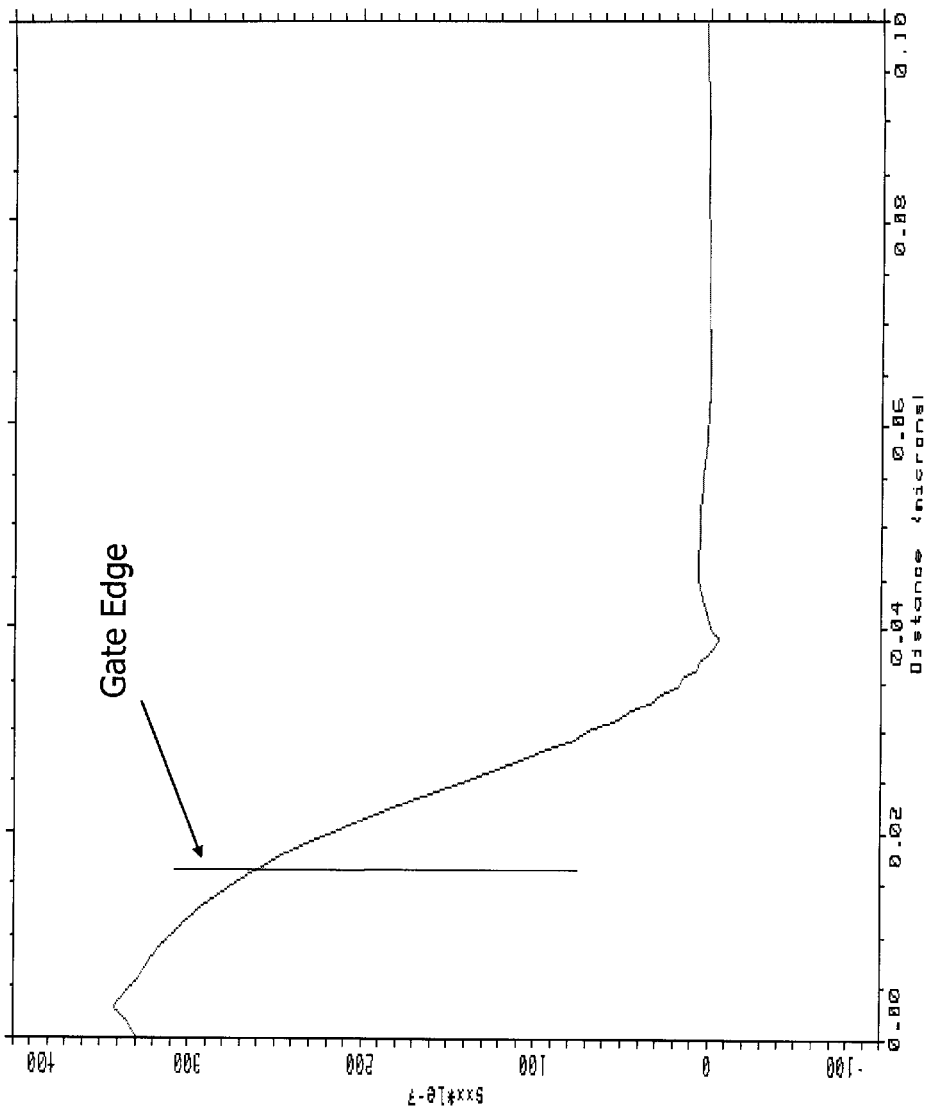

FIGS. 2a and 2b show graphs of the stress calculations in implementing the invention. In particular, these graphs show the longitudinal (in direction of current flow) tension that the elastic stress transfer accomplishes on an initially unrelaxed SiGe. As shown in FIG. 2a, tensile stresses are present in the channel of the nFET channel using a Ge content of 20% and a Si layer of 20 nm. As shown in FIG. 2a, the stress magnitude is close to maximum under the gate.

As further shown in FIG. 2b, the longitudinal tensile stress value is greatest nearest the edge of the gate Moving towards the gate from the edge of the underlying SiGe (about 0.04 microns distance from the gate edge), the stress level increases considerably to as much as 350 MPa near the gate edge.

Figure 2C:
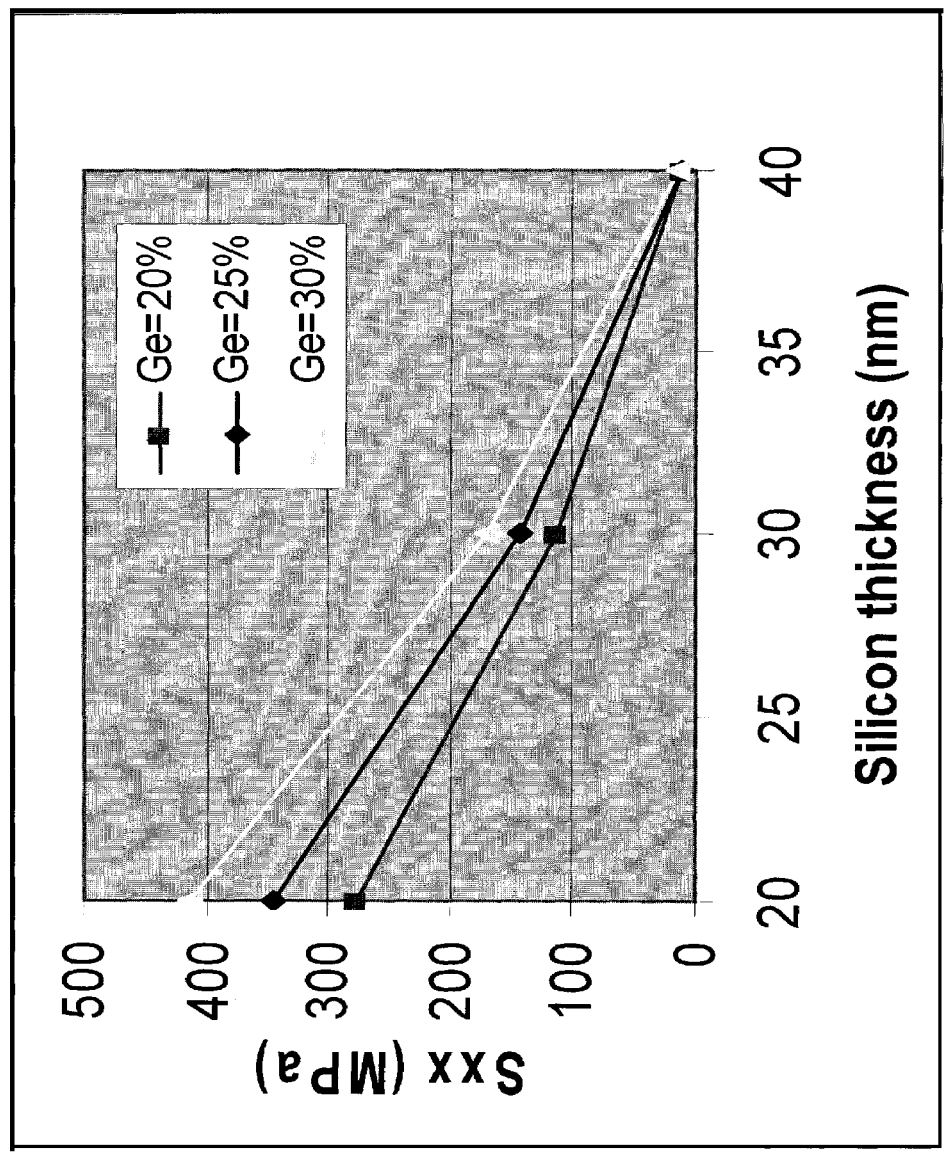
FIG. 2c shows a plot of the stress state in the Si channel region below the surface.

FIG. 2c shows the average longitudinal tensile stress in the channel for various process and structural considerations. For example, FIG. 2c shows average channel stress levels for germanium content of 20%, 25% and 30%, respectively. In embodiments of the invention, the stress levels were calculated for different germanium content (20%, 25% and 30%), over a range of silicon thicknesses (20 nm-40 nm), with the highest germanium content and lowest silicon thickness having the greatest calculated stress level. For example, a stress level of approximately 400 MPa was obtained for a Ge content of 30% with a silicon thickness of 20 nm.

Thus, in the structure of the invention, tensile stresses are formed in the channel of NFET and the number and propagation of misfit dislocations are greatly reduced by the addition of small amounts of carbon in the interface region of the stress inducing layer and the stress receiving layer. Likewise, in alternative embodiments, the number and propagation of misfit dislocations are greatly reduced by the carbon doped stress inducing layer or a combination of the carbon doped stress inducing layer and carbon at the interface between the stress inducing layer and the stress receiving layer. By implementing such stresses and controlling the occurrence of misfit dislocations, high device performance can be achieved. In addition, with the processes of the invention, the manufacturing costs can be reduced while receiving higher yields.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A method of fabricating a semiconductor structure, comprising:
    forming a stress receiving layer over a stress inducing layer with an interface therebetween; and
    providing a carbon doping of material at the interface between the stress receiving layer and the stress inducing layer to reduce misfit dislocations at the interface, wherein
    the stress inducing layer comprises at least one of a relaxed and unrelaxed SiGe layer and the stress receiving layer is an upper Si layer,
    the carbon doping is provided:
        at an interface between the stress receiving layer and the stress inducing layer;
        at the interface between the stress receiving layer and the stress inducing layer and forms a carbon doped stress inducing layer; or
        to form a carbon doped stress inducing layer,
    a percentage of the carbon doping is between about 0.01% and about 1% (atomic percent),
    the doping comprises a thickness of approximately 50 Å to 500 Å at the interface,
    the doping is imparted at least one of during the forming of the stress inducing layer and the stress receiving layer,
    a tensile stress formed by the stress inducing layer is stabilized by a doping at the interface of the stress inducing layer and the stress receiving layer, and
    further comprising:
        forming a first gate over the stress receiving layer;
        protecting portions of the first gate, the stress receiving layer, the stress inducing layer and the material;
        forming openings in unprotected portions of the stress receiving layer, the stress inducing layer and the material between the first gate and a shallow trench isolation structure; and
        filling the openings with an epitaxial material.

2. A semiconductor structure, comprising:

at least one gate stack disposed on a stress containing structure having a first material, a second material and a carbon doped material, the carbon doped material configured to reduce misfit dislocations in the structure, the carbon doped material being at least one of:
- an interface of the first material and the second material;
- present in the first material forming a carbon doped first material; or
- present in the second material forming a carbon doped second material; and an epitaxial material filled in openings of the stress receiving layer, the stress inducing layer and the carbon doped material between the at least one gate stack and a shallow trench isolation structure, wherein the first material is a stress inducing material and the second material is a stress receiving layer, the carbon doped material at the interface has a thickness in a range of approximately 50 Å to 500 Å, the carbon doped material is doped into at least one of the stress inducing and stress receiving material at a percentage between 0.01% and 1.0% (atomic percent), and the stress inducing material is relaxed or initially unrelaxed SiGe and the stress receiving material is Si.

* * * * *